(12) United States Patent
Smolarek

(10) Patent No.: US 11,258,224 B2
(45) Date of Patent: Feb. 22, 2022

(54) SENSOR SYSTEM

(71) Applicant: ASML Netherlands B.V., Veldhoven (NL)

(72) Inventor: Szymon Dominik Smolarek, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/969,071

(22) PCT Filed: Jan. 24, 2019

(86) PCT No.: PCT/EP2019/051790
§ 371 (c)(1),
(2) Date: Aug. 11, 2020

(87) PCT Pub. No.: WO2019/162038
PCT Pub. Date: Aug. 29, 2019

(65) Prior Publication Data
US 2021/0066877 A1 Mar. 4, 2021

(30) Foreign Application Priority Data
Feb. 20, 2018 (EP) .................... 18157666

(51) Int. Cl.
*H01S 3/00* (2006.01)
*G01B 7/004* (2006.01)
(Continued)

(52) U.S. Cl.
CPC ............ *H01S 3/0014* (2013.01); *G01B 7/004* (2013.01); *G01K 7/16* (2013.01); *G03F 7/70025* (2013.01);
(Continued)

(58) Field of Classification Search
CPC .... H01S 3/0014; H01S 3/0071; H01S 3/2232; H05G 2/008; G01B 7/004; G01K 7/16;
(Continued)

(56) References Cited

U.S. PATENT DOCUMENTS

| | | |
|---|---|---|
| 3,939,706 A | 2/1976 | Pinson |
| 4,692,623 A | 9/1987 | Roberts et al. |
| 2008/0017810 A1 | 1/2008 | Frijns |

FOREIGN PATENT DOCUMENTS

GB    2 226 132 A    6/1990

OTHER PUBLICATIONS

International Search Report and Written Opinion of the International Searching Authority directed to related International Patent Application No. PCT/EP2019/051790, dated Apr. 12, 2019; 12 pages.

(Continued)

*Primary Examiner* — Nicole M Ippolito
*Assistant Examiner* — Hanway Chang
(74) *Attorney, Agent, or Firm* — Sterne, Kessler, Goldstein & Fox P.L.L.C.

(57) ABSTRACT

A system, comprising an optical component that, in operational use of the optical component, optically interacts with a laser beam, an electrically conductive element disposed on or within the optical component that, in operational use of the optical component, is exposed to the laser beam, and a monitoring system operative to monitor a physical quantity representative of an electrical resistance of the electrically conductive element and to determine based on the physical quantity, a position of the laser beam relative to the optical component.

20 Claims, 6 Drawing Sheets

(51) Int. Cl.
   *G01K 7/16*       (2006.01)
   *G03F 7/20*       (2006.01)
   *H05G 2/00*       (2006.01)
   *H01S 3/223*      (2006.01)

(52) U.S. Cl.
   CPC ........ *G03F 7/70033* (2013.01); *G03F 7/7055* (2013.01); *H01S 3/0071* (2013.01); *H05G 2/008* (2013.01); *H01S 3/2232* (2013.01)

(58) Field of Classification Search
   CPC ... G03F 7/70025; G03F 7/0033; G03F 7/7055
   See application file for complete search history.

(56) References Cited

OTHER PUBLICATIONS

International Preliminary Report on Patentability directed to related International Patent Application No. PCT/EP2019/051790, dated Aug. 27, 2020; 9 pages.

H.E. Bennett, "Insensitivity of the catastrophic damage threshold of laser optics to dust and other surface delects", *Laser Induced Damage in Optical Materials: 1980*, U.S. Department of Commerce/ National Bureau of Standards, Oct. 1981; pp. 256-264.

SENSOR SYSTEM

CROSS-REFERENCE TO RELATED APPLICATIONS

This application claims priority of EP application 18157666.1 which was filed on Feb. 20, 2018 and which is incorporated herein in its entirety by reference.

FIELD

The present invention relates to systems and methods for determining characteristics of a laser beam and has particular, but not exclusive, application to a sensor system for determining a position of a laser beam. The sensor system may be used in connection with a laser for use in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In an EUV radiation source EUV radiation may be formed by illuminating a fuel target with a laser beam. For example, the laser beam may be directed to be incident on a droplet of fuel (e.g. a droplet of tin) so as to ignite the fuel to form an EUV radiation emitting plasma. The emitted EUV radiation may be collected by a radiation collector and directed to an EUV lithographic apparatus.

The laser beam which is directed to be incident on the fuel may be emitted from a laser (e.g. a CO2 laser) which is separated from the rest of the radiation source. The laser beam may be delivered to the rest of the radiation source (e.g. by a beam delivery system) and may be directed to be incident on the fuel via one or more optical components, such as mirrors, lenses and windows (i.e. components which optically interact with the laser beam). For example, the laser beam may undergo reflection at several mirrors. Additionally the laser beam may enter a section of the radiation source through a transmissive window. In order to generate EUV radiation with required characteristics, the laser beam must be targeted with very high precision. Complex sensors may be used to obtain information about the presence and/or position of the laser beam. Such sensors generally require a portion of the laser beam to be sampled by reflecting the portion of the laser beam towards metrology units such as image sensors or photodetectors. Such metrology units require ports to be added to the laser system. Additionally, sampling of the laser beam in this way reduces the amount of power in the portion of the laser beam that is provided to the radiation source. Further, due to space restrictions within some components of the laser and/or of the laser beam delivery systems used to pass the laser beam to the fuel, the use of such metrology units is not currently possible at all locations of interest.

SUMMARY

According to a first exemplary arrangement described herein, there is provided a system, comprising an optical component located in a path of a laser beam, and a sensor system. The sensor system comprises an electrically conductive element disposed at the optical component. During operational use of the optical component, the laser beam is incident on the electrically conductive element. The system further comprises a monitoring system operative to monitor a physical quantity representative of an electrical resistance of the electrically conductive element. The monitoring system is operative to determine, based on the physical quantity, at least one selected from the list comprising: a position of the laser beam relative to the optical component; and a temperature of the optical component.

The first exemplary arrangement allows for monitoring of characteristics of the laser beam without the use of complex, bulky and expensive metrology systems. In this way, monitoring of characteristics of the laser beam is possible in volume restricted areas, such as seed lasers and focus units of a laser system configured to provide the laser beam. The electrically conductive element of the first exemplary arrangement is directly integrated with the optical component, thereby providing inline, direct information about the position of the laser beam with respect to the optical component. Additionally, no alignment is required between position sensors and the laser beam, since the electrically conductive element of the sensor system is integrated directly in the path of the laser beam. The arrangement can be used for a number of purposes, including, for example, beam path setup, diagnostics and inline control (feedback signal for mirror steering) of the laser beam. Additionally, the sensor system of the first exemplary aspect can be used to measure other characteristics of the laser beam, such as beam diameter and beam power, simultaneously with the measurement of the position of the laser beam.

The system may further comprise a positional control system operative to determine an adjustment to be made to operation of a further component based on the physical quantity. In this way, the apparatus can provide feedback-based adjustment information to assist in the adjustment of operation of other components associated with the laser beam. Examples of further components, the operation of which may be adjusted include components of a laser configured to generate the laser beam, and components of a beam delivery system configured to deliver the laser beam to a predetermined site.

The positional control system may be operative to adjust the component to operate in accordance with the adjustment. In this way, the system can be used to automatically carry out adjustments. The positional control system may be operative to adjust at least one of: a spatial attribute of the optical component and a further spatial attribute of a further optical component located on the path of the laser beam. The system may further comprise a thermal control system operative to control a temperature of the optical component in dependence on the physical quantity monitored.

The electrically conductive element may comprise a line of electrically conductive material having a width that is less than a wavelength of the radiation beam. In this way, the presence of the electrically conductive element in the path of the laser beam will have no significant effect on a far field of the laser beam. Additionally, unintended reflection of the laser beam will be reduced.

The electrically conductive element may be formed from a material comprising at least one noble metal. In this way, chemical interaction of the electrically conductive element with the ambient gas may be reduced or avoided.

The electrically conductive element may be one of a plurality of electrically conductive elements disposed on or within the optical component. The monitoring system may be operative to monitor physical quantities representative of an electrical resistance of each of the plurality of electrically conductive elements and to determine based on the physical quantities monitored, a position of the laser beam relative to the optical component. By providing a plurality of electrically conductive elements, more accurate information may be obtained regarding the position of the laser beam with respect to the optical component.

At least one of the plurality of electrically conductive elements may be electrically isolated from a second one of the plurality of electrically conductive elements. In this way, changes in the electrical properties (such as a resistance) of one of the electrically conductive elements will not affect measurement of resistance of others of the electrically conductive elements.

At least one of the plurality of electrically conductive elements may be provided at a first depth along a path of incidence of the laser beam and at least another one of the plurality of electrically conductive elements provided at a second depth along the path of incidence of the laser beam. In this way, electrical isolation of the electrically conductive elements from one another may be more easily achieved. For example, where the optical component comprises a transmissive optic (such as a window or a lens), the electrically conductive elements may be provided on opposing surfaces of the optical component (e.g., on alternate sides of a window or lens).

The plurality of electrically conductive elements may form a grid pattern when viewed along a direction of incidence of the laser beam at the optical component. A grid pattern may provide a particularly suitable arrangement of electrically conductive elements to allow for ease of production of the sensor system and accurate determination of a position of the laser beam. The grid pattern may comprise a first plurality of electrically conductive elements extending in a first direction and disposed at a first depth along a path of incidence of the laser beam. The grid pattern may further comprise a second plurality of electrically conductive elements extending in a second direction and disposed at a second depth along a path of incidence of the laser beam.

The optical component may be a functional component of any one of: a laser system configured to generate the laser beam, a beam delivery system configured to deliver the laser beam from the laser system to the fuel target in a radiation source, a radiation source and/or a lithographic apparatus. By the term functional, it is intended that the component has a function additional to, and separate from, providing a platform for the electrically conductive elements.

The optical component may comprise, for example, a mirror, a lens and a window that is substantially transparent to the laser beam.

The optical component may be one of a plurality of optical components. The sensor system may comprise at least one electrically conductive component disposed on each one of the plurality of optical components respectively. The monitoring system may be configured to determine a position of the laser beam relative to each of the plurality of optical components. By providing a sensor system that monitors a beam position with respect to a plurality of optical components, the system enables more accurate determination of characteristics of the laser beam and therefore facilitates more accurate adjustment.

In a second exemplary arrangement described herein, there is provided a radiation system. The radiation system comprises a laser for producing a laser beam, a laser produced plasma (LPP) radiation source for producing a plasma through interaction of the laser beam with a fuel target, and the system of the first exemplary arrangement.

In a third exemplary arrangement described herein, there is provided a lithographic system. The lithographic system comprises a lithographic apparatus and a radiation system of the second exemplary arrangement.

In a fourth exemplary arrangement described herein, there is provided an optical component configured for use in the system of the first exemplary arrangement, the radiation system of the second exemplary arrangement or the lithographic system of the third exemplary arrangement. For example, the optical component may comprise an electrically conductive element disposed on or within the optical component that, in operational use of the optical component, is exposed to a laser beam.

In a fifth exemplary arrangement described herein, there is provided a method. The method comprises monitoring a physical quantity representative of an electrical resistance of an electrically conductive element disposed on or within an optical component that, in operational use of the optical component, is exposed to a laser beam; and determining based on the physical quantity, at least one selected from the list comprising: a position of the laser beam relative to the optical component; and a temperature of the optical component.

Features described in the context of one aspect may be used with other aspects. For example, it will be appreciated that the method of the fifth exemplary arrangement may perform any processing described in connection with the monitoring system of the first exemplary arrangement or the monitoring system described below.

BRIEF DESCRIPTION OF THE DRAWINGS

Embodiments of the invention will now be described, by way of example only, with reference to the accompanying schematic drawings in which like reference numerals indicate like components. In the drawings.

DETAILED DESCRIPTION

Figure 1:
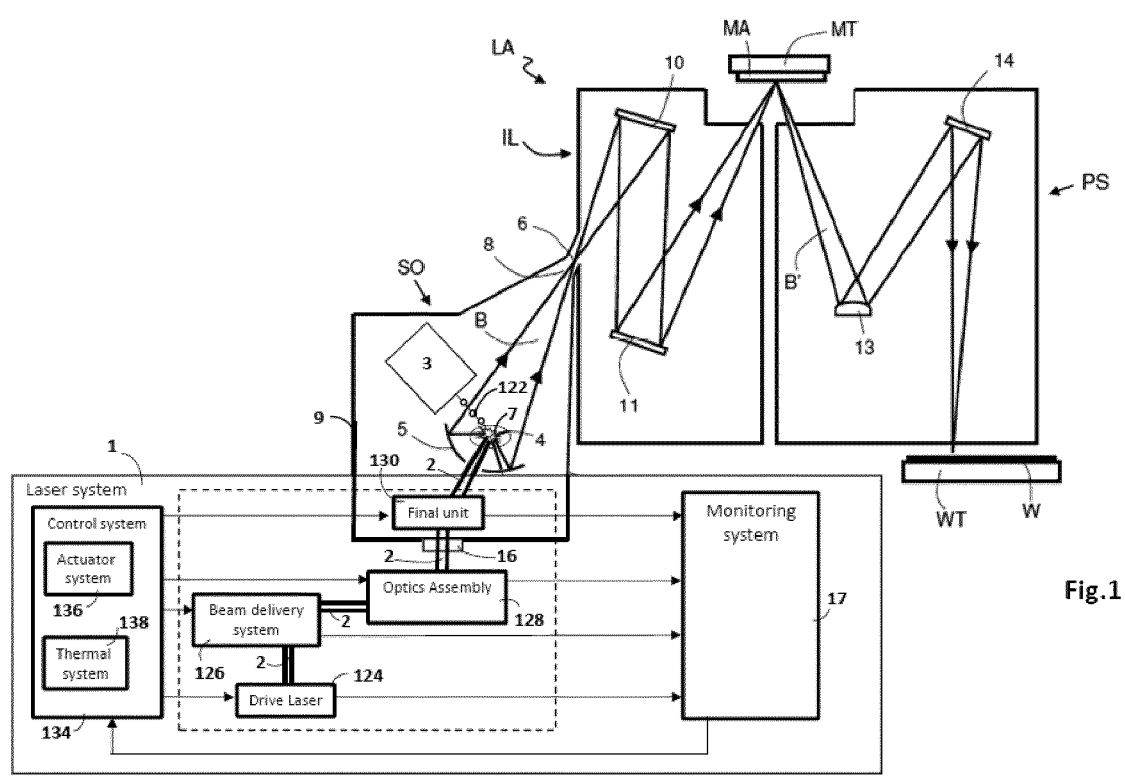
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ drive laser 124, is arranged to deposit energy via a laser beam 2 into a fuel, such as tin (Sn) which is provided from, e.g., a fuel emitter 3. Other types of drive lasers are feasible, such as a solid-state laser, e.g., a YAG laser. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. In order to not obscure the drawing, only a single droplet in a sequence of droplets is indicated with reference numeral 122. The laser beam 2 is incident upon the tin droplet at the plasma formation region 4. The deposition of laser energy into the tin droplet creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect and focus EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

As will be appreciated by those skilled in the art, the laser system 1 may comprise a plurality of optical components with which the laser beam interacts before the laser beam 2 hits the droplet present at the plasma formation location 4. The laser system 1 as drawn includes, in addition to the drive laser 124, a beam delivery system 126. Typically, the drive laser 124 may be spatially separated from the radiation source SO. Where this is the case, the laser beam 2 may be passed from the drive laser 124 to the radiation source SO with the aid of the beam delivery system 126. The beam delivery system 126 comprises optical components such as, for example, directing mirrors , a beam expander, and other optics. After the beam delivery system 126, the laser beam 2 passes an optics assembly 128, a window 16 and a final unit 130 before hitting the droplet at the plasma formation region 4. The optics assembly 128 and the final unit 130 again comprise optical components for directing and conditioning the laser beam 2. Such optical components may include one or more mirrors, one or more beam expanders, one or more beam compressors, etc. For completeness, it remarked here that a beam expander or a beam compressor is typically implemented using mirrors. The window 16 serves to preserve the relative vacuum in the enclosing structure 9, while allowing the laser beam 2 to pass.

The radiation from the plasma that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

As is described in further detail below, the laser system 1 comprises a monitoring system 17. The monitoring system 17 is configured to monitor for a position of the laser beam 2 on an optical component that is located in the path of the laser beam 2. Examples of such optical component are the window 16 through which laser beam 2 enters the enclosing structure 9. Other examples of such optical component are a lens in the drive laser 124, a mirror in the drive laser 124, a window in the drive laser 124, a mirror in the beam delivery system 126, a mirror in the optics assembly 128, a window in the optics assembly 128, a mirror in the final unit 130, a window in the final unit 130, etc. A proper position of the laser beam 2 relative to the optical component on the path of the laser beam 2 is relevant to the alignment of the laser beam 2 relative to the eventual position of the droplet at the plasma formation region 4. Such a droplet, when produced by the fuel emitter 3 has a typical dimension in the range of a few tens of microns. Given the fact that the drive laser 124 provides the laser beam 2 in pulses, e.g., in the nanosecond range or, even in the picosecond range, it is clear that a proper alignment of the laser beam 2 and proper timing of the laser pulses determine the performance of the EUV radiation source SO.

Alternatively, or in addition, the monitoring system 17 is configured to monitor a temperature of such an optical component located in the path of the laser beam 2. The laser beam 2 may be a high-power laser beam, and the optical components in the path of the laser beam 2 are therefore exposed to high thermal loads. The optical components are therefore typically cooled or otherwise thermally conditioned. For example, too high a temperature of such an optical component will not only noticeably affect the characteristics, e.g., the wavefront of the radiation of the laser beam 2, in an undesired manner but, more seriously, may even lead to destruction of the optical component and, therefore to paralyzing the entire lithographic system.

As specified above, the monitoring system 17 monitors one or more optical components in the path of the laser beam 2. Upon detecting a discrepancy between, on the one hand, the relative position of the laser beam with respect to a monitored optical component and, on the other hand, a desired position of the laser beam with respect to the optical component, the monitoring system 17 provides an output signal to a control system 134. The control system 134 comprises, for example, an actuator system 136 that is operative to adjust a spatial attribute of an optical component within the laser system 1, such as a position of the optical component along the path of the laser beam 2, an orientation (yaw, pitch, roll) of the optical component or a curvature of the optical component, in dependence on the output signal from the monitoring system 17. To this end, one or more actuators (not shown) are provided which are configured to adjust the spatial attribute under control of the output signal from the monitoring system 17. For completeness it is remarked that, for clarity, the actuator system 136 is drawn in FIG. 1 as spatially separated from the drive laser 124, from the beam delivery system 126, from the optics assembly 128 and from the final unit 130 that each may include one or more optical components being monitored. The actuator system 136 may include one or more actuators located at the optical component whose spatial attribute is rendered adjustable under control of the signal provided by the monitoring system 17.

As specified above, the monitoring system 17 may monitor a temperature of an optical component that is accommodated at the drive laser 124, or accommodated at the beam delivery system 126, or accommodated at the optics assembly 128, or accommodated at the final unit 130. Upon detecting a discrepancy between, on the one hand, the temperature as monitored and, on the other hand, a desired temperature, the monitoring system 17 provides an output signal to the control system 134. The control system comprises, for example, a thermal control system 138 that is configured to control the temperature of the optical component in dependence on the output signal from the monitoring system 17. An optical component in the path of the laser beam 2 is typically cooled via cooling water in thermal contact with the optical component. For example, a mirror has its reflective surface in thermal contact with bulk material through which channels run that serve as conduits for the cooling water flowing through the laser system. Lenses and mirrors are typically cooled via their mountings that have channels for cooling water. The output signal from the monitoring system 17 is then used via the thermal control system 138 for control of the water flow local to the monitored optical component. The thermal control system 138 may be further operable to reduce a power of the laser beam 2 or to pause the generation of the laser beam 2.

Figure 2:
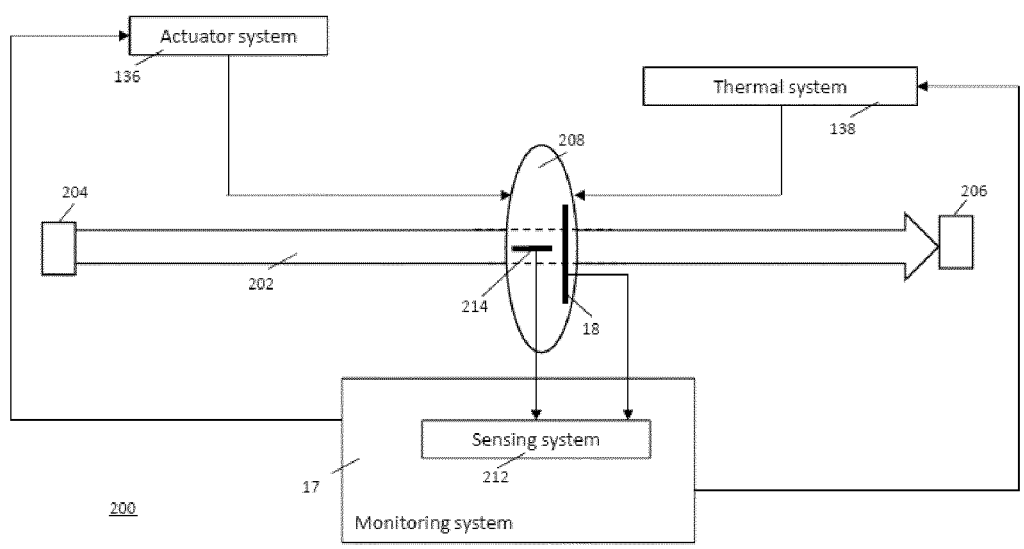
FIG. 2 depicts an example sensor system for determining one or more characteristics of a laser beam.

FIG. 2 is a diagram of a first embodiment 200 of a system according to the invention. The system 200 comprises a path 202 for the laser beam 2, the path being considered between an entrance 204 and an exit 206. An optical component 208 of the laser system 1 of FIG. 1 is located on the path 202. The optical component 208 includes, e.g., a mirror, a lens or a window, as discussed supra.

The optical component 208 comprises an electrically conductive element 18 exposed to the laser beam 2 in operational use of the embodiment 200 in the lithographic system discussed with reference to FIG. 1. The monitoring system 17 comprises a sensing system 212 configured to sense a physical quantity representative of an electrical resistance of the electrically conductive element 18. The optical component 208 may comprise one or more further electrically conductive elements exposed to the laser beam 2, for example, the further electrically conductive element 214. The sensing system 212 may then be configured to sense a further physical quantity representative of a further electrical resistance of the further electrically conductive element 214. Embodiments of the sensing system 212 will be discussed further below. Based on the one or more physical quantities thus sensed, the monitoring system 17 supplies a signal to the actuator system 136. The actuator system 136 comprises, for example, one or more piezo-actuators, or stepper motors, etc. In response to the signal received, the actuator system 136 adjusts a spatial attribute of the optical component 208. For example, the spatial attribute is one or more of: a position of the optical component along the path 202, an orientation of the optical component 208 with respect to the direction of the incident laser beam 2, a curvature of a surface of the optical component 208, the surface interacting with the laser beam 2.

In the embodiment 200, the monitoring system 17 may provide a further signal to the thermal system 138 that in response thereto controls a temperature of the optical component 208, e.g., via adjustment of the cooling water flow.

Figure 3:
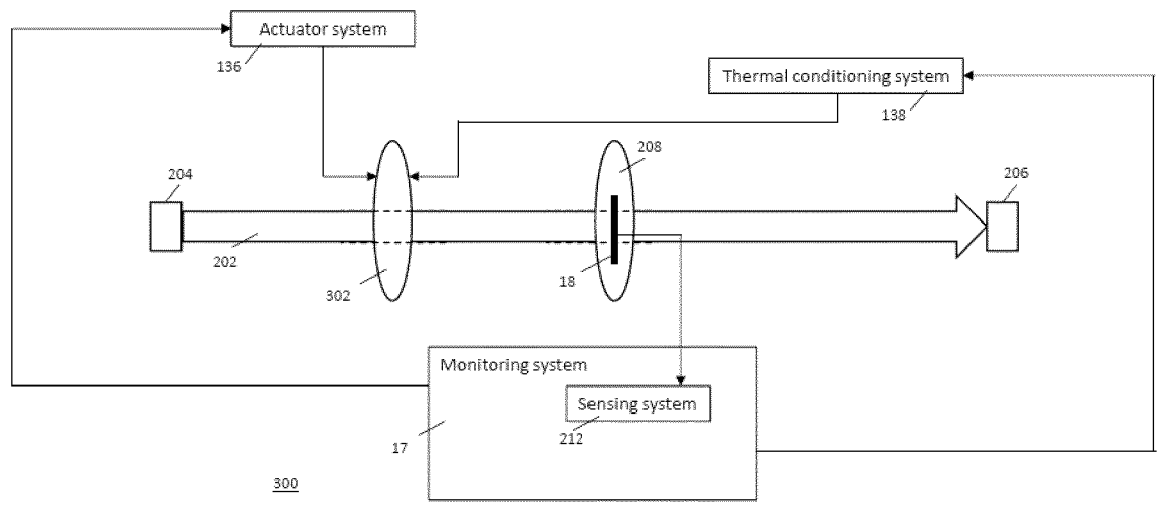
FIG. 3 depicts a further example sensor system for determining one or more characteristics of a laser beam.

FIG. 3 is a diagram of a second embodiment 300 of a system in the invention. The second embodiment 300 comprises the optical component 208 that is provided with the electrically conductive element 18. The second embodiment 300 further comprises the monitoring system 17 that includes the sensing system 212. The second embodiment 300 also includes the actuator system 136 and the thermal system 138. The second embodiment 300 has a further optical component 302 positioned on the path 202, for example, so as to have the further optical component 302 precede the optical component 208 in the direction of propagation of the laser beam 2. In the second embodiment 300, the sensing system 212 is operative to sense a physical quantity representative of an electrical resistance (or electrical conductivity) of the electrically conductive element 18. The monitoring system 17 then supplies a signal to the actuator system 136 that is operative to adjust a spatial attribute of the further optical component 302 so as to adjust a position of the laser beam 2 relative to the optical component 208. Examples of the spatial attribute have been given above. Similarly, the monitoring system 17 may provide another signal to the thermal conditioning system 138 that is operative to adjust the thermal conditioning of the optical component 208 (and/or of the further optical component 302), e.g., by control of the flow rate of the cooling water.

Figure 4:
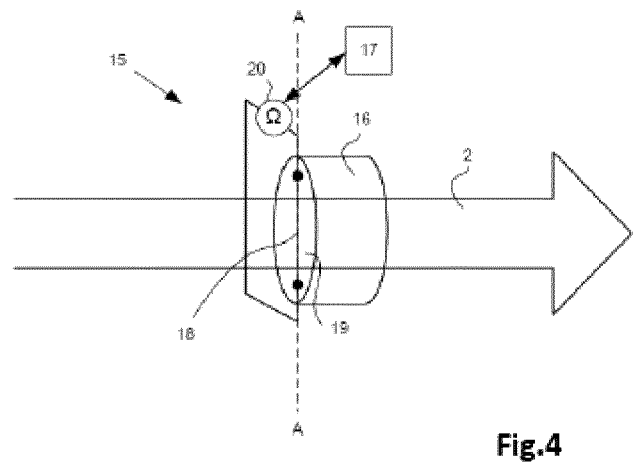
FIGS. 4 and 5 depict a further example sensor system for determining one or more characteristics of a laser beam.

FIG. 4 schematically depicts an example 15 of the sensing system 212 interacting with the electrically conductive element 18 in more detail. In FIG. 4, the electrically conductive element 18 is provided on a surface 19 of the optical component 208, that here is the window 16, shown in the diagram of FIG. 1. The electrically conductive element 18 comprises a line (or: "trace") of electrically conductive material, the line defining a longitudinal axis A (depicted extending vertically when the page is viewed in portrait). The surface 19 is the "front" or outer-facing surface of the window 16 (i.e. the surface that does not face into the source SO), although it is to be understood that this is only by way of example and that the electrically conductive element 18 may alternatively be provided elsewhere on the optical component 19 (such as on the inner-facing surface of the window 16 or embedded within the window 16).

The sensing system 212 includes an instrument 20 configured to enable measurement of electrical resistance within the electrically conductive element 18. The instrument 20 may include, e.g., an ohmmeter. While the monitoring system 17 is schematically depicted by a single box in FIGS. 1, 2, 3 and 4, it is to be understood that the monitoring system 17 may comprise a plurality of components and may comprise, for example, one or more computing devices or signal processing devices as will be apparent to the skilled person.

Receipt of the laser beam 2 on the window 16 (e.g. during use of the laser system 1 to generate a radiation beam B by the source SO), may change the temperature of the window 16 at the location of the electrically conductive element 18. As the electrically conductive element is in thermal contact with the window, the electrically conductive element 18 will also experience a changing temperature, that alters the resistance of the electrically conductive element 18. For example, the electrically conductive element 18 may comprise a material that exhibits a positive or negative temperature coefficient of electrical resistance and/or positive or negative photoconductivity. In this way, by detecting a resistance of the electrically conductive element 18, the monitoring system 17 can determine whether/where the laser beam 2 is incident on the window 16.

Additionally, as is described in more detail below, where the intensity profile of the laser beam 2 is different across the cross-sectional area of the laser beam 2, by detecting a resistance of the electrically conductive element 18, the monitoring system 17 may determine information about a position of the laser beam 2 with respect to the window 16. In more detail, the location of the electrically conductive element 18 with respect to the window 16 may be known. By way of example only, the electrically conductive element 18 may be disposed at a central portion of the window 16. Where a detected resistance of the electrically conductive element 18 is expected to result from exposure of the window 16 by a particular area of the cross-section of the laser beam 2, the monitoring system 17 may determine that the particular area is currently incident on the known location of the window 16.

While, in general, the electrically conductive element 18 may comprise any suitable material which provides a change in electrical resistance in response to a change in temperature, the particular choice of material for the electrically conductive element 18 may depend upon specific and varying application requirements. Additionally, while the electrically conductive element 18 is placed on the window 16, as described above, the sensing system 212 may additionally or alternatively comprise electrically conductive elements placed on other optical components on the path of the laser beam 2 towards the fuel droplet at the plasma formation location 4. The selection of material for electrically conductive elements may depend on the optical component on which the electrically conductive element is placed.

In some example arrangements it may be desirable to select a material for the electrically conductive element 18 that is resistant to oxidation. For example, in some example arrangements, the electrically conductive element 18 may comprise a noble metal such as platinum, gold or silver. In some example arrangements, the electrically conductive element 18 may comprise an anti-oxidation layer. An additional consideration in selecting the material for the electrically conductive element 18 may, for some applications, be the magnitude of the resistance-change in response to the temperature change of the electrically conductive element caused by the presence of the laser beam 2 at the optical component accommodating the electrically conductive element 18. For example, it may be desirable to select a material having a high temperature coefficient of electrical resistance. For example, suitable materials such as silver, gold and platinum have temperature coefficients of electrical resistance of approximately 0.0038 per degree C., approximately 0.0039 per degree C. and 0.0034 per degree C. respectively.

Where an electrically conductive element is positioned on a surface of an optical component (i.e. not embedded within an optical component), it may be desirable for the electrically conductive element to have a sufficiently low surface diffusion factor to prevent diffusion across the surface on which it is positioned. It will be appreciated that the surface diffusion of an electrically conductive element may depend upon both the material of the electrically conductive element and the material of the optical component, as well as on the local temperature.

While in the example arrangement of FIG. 4, the electrically conductive element 18 is shown as being present on the surface 19 of the window 16 the electrically conductive element 18 may be provided on or within the window 16. For example, in other example arrangements, an electrically conductive element may be embedded within an optical component. In this way, for example, oxidation and surface diffusion of electrically conductive elements may be reduced.

With reference again to FIG. 4, the electrically conductive element 18 may be applied to the surface 19 of the window 16 using any suitable technique. By way of example only, the electrically conductive element 18 may be applied to the optical component by selective deposition using techniques including any one or more of lithography, screen printing, inkjet printing, laser printing, additive manufacturing, etc. In an embodiment, the electrically conductive element 18 may be applied to the optical component through a carbonization process. For example, a laser may be directed at a surface of the optical component in order to cause surface carbonization of a portion of the surface of the optical component. The carbonized portion of the surface may provide the electrically conductive element 18.

It will be appreciated that while the optical component 16 takes the form of a transmissive optic (in particular, a window or a lens), the techniques described herein are equally applicable to reflective optics (in particular, a mirror).

In order to reduce any effects on the electrical resistance of the electrically conductive element 18 from the surface of the optical component on which it is applied, it is desirable that the electrically conductive element 18 is electrically insulated from the optical component 16. For example, where the electrically conductive element 18 is applied directly to a surface of the optical component, it may be desirable to ensure that the surface of the optical component is not electrically conductive. Alternatively, where the surface of the optical component is electrically conductive, an electrically insulating barrier may be provided between the electrically conductive element 18 and the surface of the optical component. For example, an electrically non-conductive coating may be applied to either the electrically conductive element 18 or to at least a portion of the surface of the optical component to which the electrically conductive element 18 is applied to create an electrically insulating barrier between the surface of the optical component and the electrically conductive element 18. As such, it will be appreciated that where it is described that an electrically conductive element is provided on or within an optical component, this does not exclude the electrically conductive element being separated from the optical component by such an insulating barrier.

Figure 5:
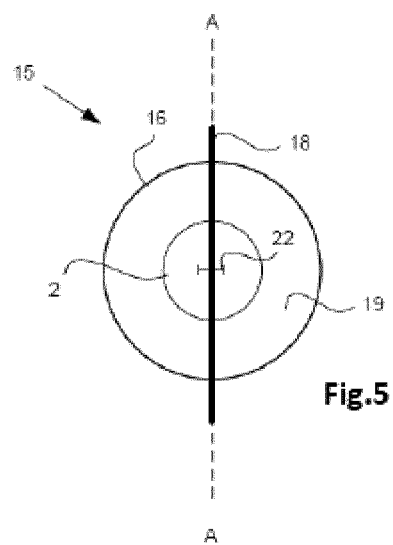

With reference to FIG. 5, a width of the electrically conductive element 18 is taken to be the extent of the electrically conductive element 18 in a direction 22 that is perpendicular to the longitudinal axis A of the electrically conductive element 18 in a plane generally defined by the surface 19 (understanding that the surface 19 may, for some optical components, be curved). The electrically conductive element 18 may have any suitable width and the actual width may depend upon the particular application.

In some example arrangements, the width of the electrically conductive element 18 is preferably small. In some example arrangements, the width of the electrically conductive element 18 is less than a wavelength of the laser beam 2. In this way, the presence of the electrically conductive element 18 in the path of the laser beam 2 will have no significant effect on the far field of the laser beam 2 and unintended reflection of the laser beam 2 by the electrically conductive element 18 will be reduced. For example, where the laser system 1 comprises a $CO_2$ laser, the electrically conductive element may have a width of less than approximately 9-10 micrometres. Further, as the width of the electrically conductive element increases, this may lead to greater exposure of the electrically conductive element 18 to the laser radiation proper that in turn increases in the temperature of the electrically conductive element 18 during use of the laser system 1. By reducing the width of the electrically conductive element 18, undesirable heating of the optical component 18 as a result of absorption of the laser light may be reduced.

As mentioned earlier, the electrically conductive element 18 is accommodated at optical component 16 so as to get into the path of the radiation of the (high-power) laser beam, subjecting the electrically conductive element 18 to a heat load. There are two main mechanisms of heat transfer between the electrically conductive element 18 and the surrounding environment, in this case, the optical component 16.

A first mechanics relates to the heat conduction between optical component 16 and the electrically conductive element 18. Because of the large difference between the heat capacity of the optical component 16 and the electrically conductive element 18, the temperature of the electrically conductive element 18 assumes the temperature of the optical component 16. The speed of this process is mainly dependent on two factors.

A first factor is the heat conductivity of the optical component 16. The higher the heat conductivity of the material of the optical component 16 in contact with the electrically conductive element 18, the faster the temperature of the electrically conductive element 18 will reach the temperature of the optical component 16.

A second factor relates to the dimensions of the electrically conductive element 18. Within this context, reference is made to the publication "*Insensitivity of the catastrophic damage threshold of laser optics to dust and other surface defects*", H. E. Bennet, STP759-EB/October 1981, pp. 256-264. The author states, among other things, that although dust or other surface defects at a laser optics component may cause small isolated damage sites to occur, these sites will not produce catastrophic damage unless the defects exceed a critical dimension. An analysis of the temperature reached by defect sites on mirror surfaces shows that a steady state condition will exist for defects below a critical size. In such steady state, the heat loss by diffusion into the mirror surface equals the heat gain caused by irradiation.

Consider the example of the electrically conductive element 18 having the shape of a line segment, i.e., its length "L" is much greater than its width "W", whereas its thickness "TH" is negligibly small so as to be able to treat this example as two-dimensional in effect. The analysis of Bennet indicates that the smaller the ratio of the width "W" of the electrically conductive element 18 to the length "L", the faster the electrically conductive element 18 will reach the temperature of the optical component 16.

A second mechanism relates to absorption of the electromagnetic radiation of the laser beam by the electrically conductive element 18. Within the ranges of the relevant parameters involved, the absorption is proportional to surface area of the electrically conductive element 18 exposed to the electromagnetic radiation Accordingly, heat is generated in the electrically conductive element 18 as a result of the absorption of the electromagnetic radiation of the laser beam. As a result, the electrically conductive element 18 is warming up. This effect depends on the surface area "A". On the other hand, the electrically conductive element 18 cools down as a result of heat transfer to the adjacent material of the optical component 16. The heat transfer from the electrically conductive element 18 to the adjacent material of the optical component 16 depends on the heat conductivity of this adjacent material as well as on the thickness ratio of width to length of the electrically conductive element 18. Therefore, by means of a proper selection of the heat conductivity of the material of the optical component 16 AND by means of a proper selection of the dimensions of the electrically conductive element 18, the cooling will prevent the electrically conductive element getting burned by the laser beam.

Depending upon the material(s) from which the electrically conductive element 18 is formed and the placement of the electrically conductive element 18 in relation to the optical component (e.g. placed on a surface or embedded within a surface), dimensions of the electrically conductive element may be determined based upon a surface diffusion factor of the electrically conductive element 18. For example, in some example arrangements, it may be necessary to provide an electrically conductive element 18 with a width that is large enough to prevent detrimental surface diffusion of the electrically conductive element 18.

While the example arrangement shown in FIGS. 4 and 5 depicts a single electrically conductive element 18, in other example arrangements, a plurality of electrically conductive elements may be provided. By providing a plurality of electrically conductive elements, the monitoring system 17 is able to provide more accurate information about the position of the laser beam 2 relative to the optical component. Where a plurality of electrically conductive elements is provided at an optical component, one or more of the plurality of electrically conductive elements may have a different width to one or more others of the plurality of electrically conductive elements. In this way, widths of different ones of the plurality of electrically conductive elements may be tuned to provide different information to the monitoring system 17, as discussed above (e.g. information concerning position of the laser beam 2, temperature of the optical component, etc.).

Figure 6:
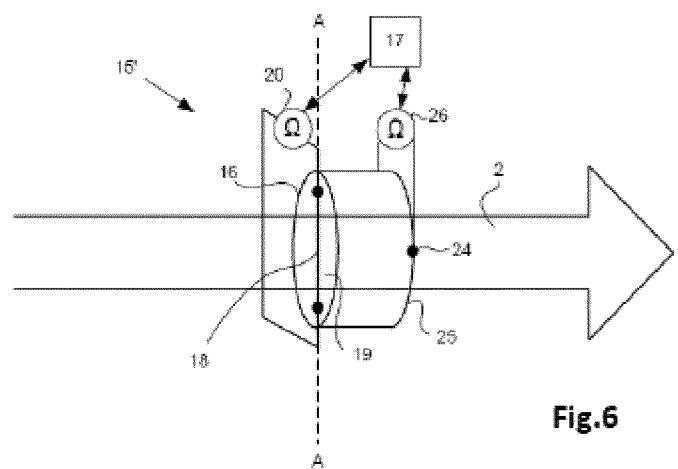
FIGS. 6 and 7 depict a further example sensor system for determining one or more characteristics of a laser beam.
Figure 7:
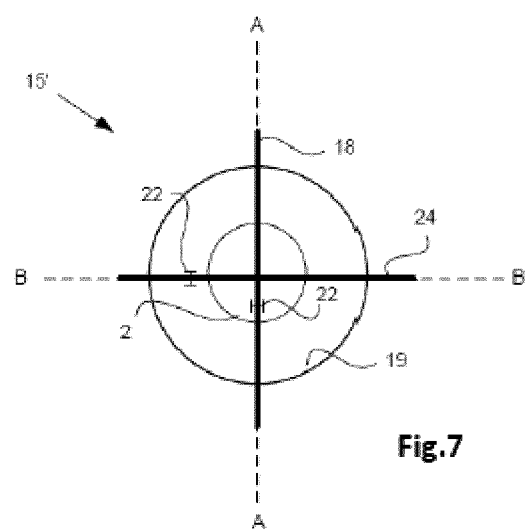

FIGS. 6 and 7 schematically depict another example 15' of the sensing system 212 interacting with the electrically conductive element 18 and a second electrically conductive element 24 accommodated at the window 16. The second electrically conductive element 24 is provided on a surface 25 of the optical component (window) 16 facing the inside of the enclosure 9 shown in the diagram of FIG. 1. The electrically conductive element 24 is electrically connected to an ohmmeter 26, which is part of the sensing system 212 of the monitoring system 17. As can be seen most clearly in FIG. 7, the element 24 has a longitudinal axis B that is perpendicular to the longitudinal axis A of the electrically conductive element 18 (depicted extending horizontally when the page is viewed in portrait). In this way, information may be gathered about a relative position of the laser beam 2 in two dimensions, and over a greater portion of the cross-sectional area of the laser beam 2, allowing for greater accuracy in determining a position of the laser beam 2 with respect to the elements 16, 24 and therefore with respect to the optical component 16.

In FIGS. 6 and 7, the electrically conductive elements 18, 24 are disposed on opposing surfaces of the optical component 16 (which opposing surfaces may be referred to as front and back respectively, or inner-facing and outer-facing respectively) in order to prevent electrical interference between the electrically conductive elements 18, 24. It will be appreciated, however, that the elements, 18, 24 may be electrically isolated from one another by other means and in any suitable manner For example, one of the electrically conductive elements 18, 24 may be embedded within the optical component 16, with the other electrically conductive element 18, 24 provided on a surface (e.g. the surface 19), or embedded at a different depth, such that the electrically conductive elements 18, 24 are separated by material of the optical component 16. In other example arrangements, the electrically conductive elements 18, 24 may be disposed generally on or adjacent the same surface of the optical component 16 (e.g. the surface 19) and an electrically insulating layer may be provided between the electrically conductive elements 18, 24. In another example arrangement, the elements 18, 24 may each be provided with a transparent (or translucent), but electrically insulating, coating or sheath to electrically isolate the electrically conductive elements 18, 24 from one another.

Figure 8:
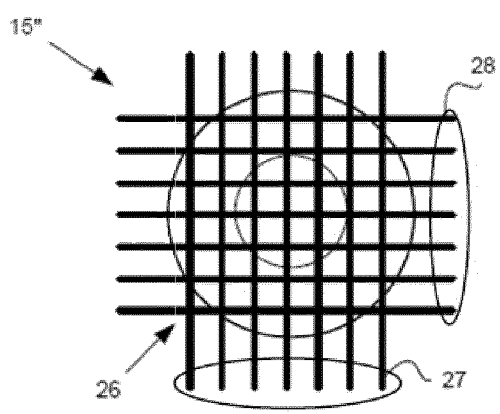
FIG. 8 depicts an arrangement of electrically conductive elements for a sensor system for determining one or more characteristics of a laser beam.

It will be appreciated that more than two electrically conductive elements may be provided at a single optical component. For example, a plurality of electrically conductive elements may be provided to form a pattern. A further example 15" is schematically depicted in FIG. 8, comprising a plurality of electrically conductive elements to form a grid pattern 26. The grid pattern 26 is formed from a first plurality of electrically conductive elements 27 (each shown extending vertically when the page is viewed in portrait) and a second plurality of electrically conducive elements 28, each extending generally perpendicularly to each of the first set of electrically conductive elements 27 (shown extending horizontally when the page is viewed in portrait). The first plurality of electrically conductive elements 27 may be electrically isolated from the second set of electrically conductive elements 28 as described above with reference to the electrically conductive elements 18, 24 in FIG. 7. By way of example only, the first plurality of electrically conductive elements 27 may be provided on a first surface of the optical component (e.g. the surface 19 of the optical component 16) while the second plurality of electrically conductive elements 28 may be provide on a second surface of the optical component (e.g. the surface 25 of the optical component 16).

Other possible arrangements and patterns of electrically conductive elements will be readily apparent to the skilled person in light of the teaching herein. It will be appreciated that, in general, a greater number of electrically conductive elements allows for more samples of the cross-sectional intensity profile to be obtained and therefore a more accurate determination of a position of the laser beam 2.

Information indicating a position of the laser beam 2 may be generated in any of a number ways. By way of example only, the monitoring system 17 may store a model of an expected electrical resistance (or expected changes in electrical resistance) of an electrically conductive element in response to exposure by radiation of various intensities. The monitoring system 17 may compare the stored model with the received values indicating a resistance (or change in resistance) of a particular electrically conductive element having a known position with respect to the optical element 16. In this way, through determining a resistance (or a change in resistance) of each of the electrically conductive elements of known position, the monitoring system 17 may generate information indicative of a position of the radiation beam. By way of a further example, the monitoring system may store a model of expected electrical resistance (or expected changes in electrical resistance) of an electrically conductive element in response to exposure by a particular predefined portion of the cross-sectional area of the laser beam 2. In this way, by the monitoring system 17 may match measured resistances of the electrically conductive elements with portions of the cross-sectional area of the laser beam 2 to determine a position of the laser beam 2 with respect to the optical component.

It will be appreciated that the particular methods and algorithms used to determine a position of the laser beam 2 will depend upon the configuration of electrically conductive elements and suitable methods will be readily apparent to the skilled person from the present disclosure.

It will be appreciated that in addition to positional information, sensor systems of the type described herein may be configured determine additional or alternative information about a laser beam, such as a cross-sectional intensity profile of the laser beam, beam diameter and beam power. Indeed, it will be appreciated that the sensor systems described herein may determine any characteristic of the laser beam 2 that may be determined by taking a sample of the cross-sectional intensity profile of the laser beam 2 using the techniques described above. Further, it will be appreciated that the sensor systems described herein may be used to determine a plurality of characteristics simultaneously.

Figure 9:
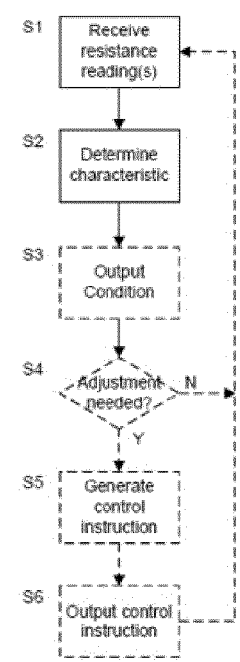
FIG. 9 is a flowchart showing an example of processing that may be performed by a monitoring system of a sensor system.

FIG. 9 is a flowchart showing an example of processing that may be performed by the monitoring system 17. At a step S1, the monitoring system 17 obtains or receives one or more values representative of an electrical resistance of one or more electrically conductive elements via the sensing system 212. At step S2, the monitoring system 17 processes the received values to determine one or more characteristics of the laser beam 2. For example, as described above, the monitoring system may be configured to determine a presence of the laser beam 2. In particular, a determination that the laser beam 2 is present (i.e. interacting with the optical component) may be made when the value representative of an electrical resistance meets a predetermined threshold or changes by at least a predetermined amount. It will be appreciated that the actual threshold will vary in dependence upon the particular application (including material and width of the electrically conductive element, the material of the optical component, the positioning of the electrically conductive element in relation to the optical component, a power the laser beam, etc.). The monitoring system 17 may additionally determine a position of the laser beam 2 as described above with reference to FIGS. 4 to 8. The monitoring system 17 may additionally or alternatively determine a temperature of the optical component associated with the sensing system 212. For example, as described above, where an electrically conductive element has a suitably narrow width (having regard to the material of the electrically conductive element and the optical component), a temperature of the electrically conductive element will be substantially equal to a temperature of the optical component on (or in) which it is disposed.

Steps S3 to S6 are depicted in dashed outline to indicate that these steps are optional to the example processing of FIG. 9. It will be appreciated, for example, that where the monitoring system 17 is configured to directly control the laser system 1, the monitoring system may not be configured to output indications of a monitored characteristic to a user by default (e.g. such outputs may instead be provided on demand or not at all).

At step S3, the monitoring system 17 may optionally output the determined characteristic. For example, the monitoring system may output an indication of the characteristic to a display device (not shown), or to any other output device as will be readily apparent to the skilled person. By outputting the determined characteristic, the monitoring system 17 allows for feedback to be provided to a user of the sensor system to allow the user to diagnose problems with, or to determine improvements that can be made to, the laser system 1, the beam delivery system and/or the lithographic apparatus.

Steps S4 to S6 are concerned with control of a component of the laser system 1, the source SO, or the lithographic apparatus LA. At step S4, the monitoring system 17 determines whether an adjustment is required, based on the characteristic determined at step S2. For example, where the characteristic is a position of the laser beam 2, the monitoring system 17 may determine that the position of the laser beam 2 is incorrect and should be adjusted. By way of further example, where the characteristic is a temperature of the optical component, the monitoring system 17 may determine that the temperature is too high and that a power of the laser beam 2 should be reduced or that the laser 1 should be paused or that the cooling water flow rate should be increased. In another example, the monitoring system 17 may determine that the temperature of the optical component is substantially below a predetermined threshold, thereby indicating, for example, that a power of the laser beam 2 may safely be increased.

If it is determined at step S4 that an adjustment is not required, processing passes back to step S1. If, on the other hand, it is determined at step S4 that an adjustment is required, processing passes to step S5, where the monitoring system 17 generates one or more control instructions suitable for controlling one or more components (e.g., the laser 1, the beam delivery system and/or one or more components of the lithographic apparatus LA). At step S6, the one or more control instructions are output to effect control of the component. Additionally or alternatively, the monitoring system 17 may, at step S4, output an indication of an adjustment to be made to a component as a prompt for an operator to make the adjustment.

Although sensor systems described above are described with reference to laser systems used in combination with EUV radiation sources, it is to be understood that the sensor systems described herein may be used with any laser system. As such, while described in combination with an EUV lithographic apparatus above, it will be appreciated that the techniques described herein may be used in with other forms of lithographic apparatus, such as deep ultra-violet (DUV) lithographic apparatuses.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A system, comprising;
    an optical component located in a path of a laser beam; and
    a sensor system, comprising:
        an electrically conductive element disposed at the optical component, wherein during use of the system the laser beam is incident on the electrically conductive element; and a monitoring system operative to monitor a physical quantity representative of an electrical resistance of the electrically conductive element and to determine, based on the physical quantity, at least one selected from the list comprising:
    a position of the laser beam relative to the optical component; and
    a temperature of the optical component.

2. The system of claim 1, further comprising a positional control system operative to determine an adjustment to be made to operation of a further component based on the physical quantity.

3. The system of claim 2, wherein the further component is a component of at least one of a laser system configured to generate the laser beam or a beam delivery system configured to deliver the laser beam to a predetermined site.

4. The system of claim 2, wherein the positional control system is operative to control the further component to adjust the position of the laser beam relative to the optical component based on the physical quantity.

5. The system of claim 4, wherein the positional control system is operative to adjust a spatial attribute of the optical component or a further spatial attribute of a further optical component located on the path of the laser beam.

6. The system of claim 1, further comprising a thermal control system operative to control a temperature of the optical component in dependence on the physical quantity.

7. The system of claim 1, wherein the electrically conductive element comprises a line of electrically conductive material having a width that is less than a wavelength of the laser beam.

8. The system of claim 1, wherein the electrically conductive element is formed from a material comprising at least one noble metal.

9. The system of claim 1, wherein:
the electrically conductive element is one of a plurality of electrically conductive elements disposed on or within the optical component; and
the monitoring system is operative to monitor physical quantities representative of an electrical resistance of each of the plurality of electrically conductive elements and to determine, based on the physical quantities, a position of the laser beam relative to the optical component.

10. The system of claim 9, wherein a first one of the plurality of electrically conductive elements is electrically isolated from a second one of the plurality of electrically conductive elements.

11. The system of claim 9, wherein a first one of the plurality of electrically conductive elements is provided at a first depth along a path of incidence of the laser beam and a second one of the plurality of electrically conductive elements is provided at a second depth along the path of incidence of the laser beam.

12. The system of claim 9, wherein the plurality of electrically conductive elements form a grid pattern when viewed along a direction of incidence of the laser beam at the optical component.

13. The system of claim 12, wherein the grid pattern comprises:
a first plurality of electrically conductive elements extending in a first direction and disposed at a first depth along a path of incidence of the laser beam; and
a second plurality of electrically conductive elements extending in a second direction and disposed at a second depth along a path of incidence of the laser beam.

14. The system of claim 1, wherein the optical component is a functional component of any one of a laser configured to generate the laser beam, a beam delivery system configured to deliver the laser beam to a radiation source, a radiation source and/or a lithographic apparatus.

15. The system of claim 1, wherein the optical component comprises a mirror, a lens, or a window.

16. The system of claim 1, wherein:
the optical component is one of a plurality of optical components;
the sensor system comprises at least one electrically conductive component disposed on each one of the plurality of optical components respectively; and
the monitoring system is configured to determine a position of the laser beam relative to each of the plurality of optical components.

17. A radiation system comprising:
a laser;
a laser produced plasma (LPP) radiation source for producing a plasma through interaction of a laser beam produced by the laser with a fuel target; and
a system comprising:
    an optical component located in a path of a laser beam; and
    a sensor system, comprising:
        an electrically conductive element disposed at the optical component, wherein during use of the system the laser beam is incident on the electrically conductive element; and
        a monitoring system operative to monitor a physical quantity representative of an electrical resistance of the electrically conductive element and to determine based on the physical quantity, at least one selected from the list comprising:
            a position of the laser beam relative to the optical component; and
            a temperature of the optical component.

18. A lithographic system comprising:
a lithographic apparatus; and
the radiation system of claim 17.

19. An optical component configured for use in a system comprising:
the optical component being located in a path of a laser beam; and
a sensor system, comprising:
    an electrically conductive element disposed at the optical component, wherein during use of the system the laser beam is incident on the electrically conductive element; and
    a monitoring system operative to monitor a physical quantity representative of an electrical resistance of the electrically conductive element and to determine based on the physical quantity, at least one selected from the list comprising:
        a position of the laser beam relative to the optical component; and
        a temperature of the optical component.

20. A method comprising:
monitoring a physical quantity representative of an electrical resistance of an electrically conductive element disposed at an optical component that, in operational use of the optical component, is exposed to a laser beam; and
determining, based on the physical quantity, a position of the laser beam relative to the optical component and/or a temperature of the optical component.

* * * * *